United States Patent
Hao

(10) Patent No.: US 10,637,233 B2
(45) Date of Patent: Apr. 28, 2020

(54) FAULT MAGNITUDE CALCULATION DURING CURRENT TRANSFORMER SATURATION

(71) Applicant: Schweitzer Engineering Laboratories, Inc., Pullman, WA (US)

(72) Inventor: Kei Hao, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 85 days.

(21) Appl. No.: 16/010,044

(22) Filed: Jun. 15, 2018

(65) Prior Publication Data

US 2019/0386485 A1 Dec. 19, 2019

(51) Int. Cl.
*H02H 7/22* (2006.01)
*H02H 1/00* (2006.01)
*G05B 19/042* (2006.01)

(52) U.S. Cl.
CPC ............ *H02H 7/22* (2013.01); *G05B 19/0428* (2013.01); *H02H 1/0007* (2013.01); *H02H 1/0092* (2013.01); *G05B 2219/2639* (2013.01)

(58) Field of Classification Search
CPC ...... H02H 7/22; H02H 1/0007; H02H 1/0092; G05B 19/0428; G05B 2219/2639
See application file for complete search history.

(56) References Cited

U.S. PATENT DOCUMENTS

| | | | | |
|---|---|---|---|---|
| 5,974,361 A | * | 10/1999 | Vu ..................... | H02H 1/046 324/620 |
| 6,040,689 A | * | 3/2000 | Gluszek .............. | G01R 19/15 324/102 |
| 9,250,282 B2 | | 2/2016 | Ukil et al. | |
| 9,366,715 B2 | | 6/2016 | Ukil et al. | |
| 2013/0141827 A1 | | 6/2013 | Ukil et al. | |
| 2013/0221977 A1 | * | 8/2013 | Ukil .................. | H02H 3/081 324/522 |

FOREIGN PATENT DOCUMENTS

CA 2929382 A1 * 5/2014
CN 106099850 A * 11/2016

OTHER PUBLICATIONS

Chothani et. al., "New Algorithm for current transformer saturation detection and compensation based on derivatives of secondary currents and Newton's backward difference formulae", IET Gener. Transco. Distrib., 2014, vol. 8, Iss. 5, pp. 841-850. (Year: 2014).*

(Continued)

*Primary Examiner* — Thomas C Lee
*Assistant Examiner* — Michael Tang
(74) *Attorney, Agent, or Firm* — Richard M. Edge

(57) ABSTRACT

Improvements in the functioning of a line-mounted device to calculate a fault current magnitude during current transformer (CT) saturation are disclosed herein. The line-mounted device may determine direct current (DC) components of a sampled current signal using valid sample pairs obtained during unsaturated regions of peaks of the sampled current signal. The DC components may be removed from the sampled current signal to produce a sinusoidal current signal. The fault current magnitude may be calculated using the sinusoidal current signal with the DC components removed.

20 Claims, 8 Drawing Sheets

(56) References Cited

OTHER PUBLICATIONS

Ukil, Abhisek, et al., "Current-Only Directional Overcurrent Relay". IEEE Sensors Journal, Nov. 22, 2010, vol. 11, Issue 6.
Ukil, Abhisek, et al., "Current-Only Directional Overcurrent Protection for Distribution Automation: Challenges and Solutions". IEEE Transactions on Smart Grid, Aug. 22, 2012, vol. 3, Issue 4.

* cited by examiner

FAULT MAGNITUDE CALCULATION DURING CURRENT TRANSFORMER SATURATION

RELATED APPLICATION none

TECHNICAL FIELD

This disclosure relates to calculating a magnitude of a fault on an electric power delivery system. More particularly, this disclosure relates to calculating the fault magnitude during current transformer saturation. This disclosure also relates to protecting an electric power delivery system using a calculated fault magnitude during current transformer saturation.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
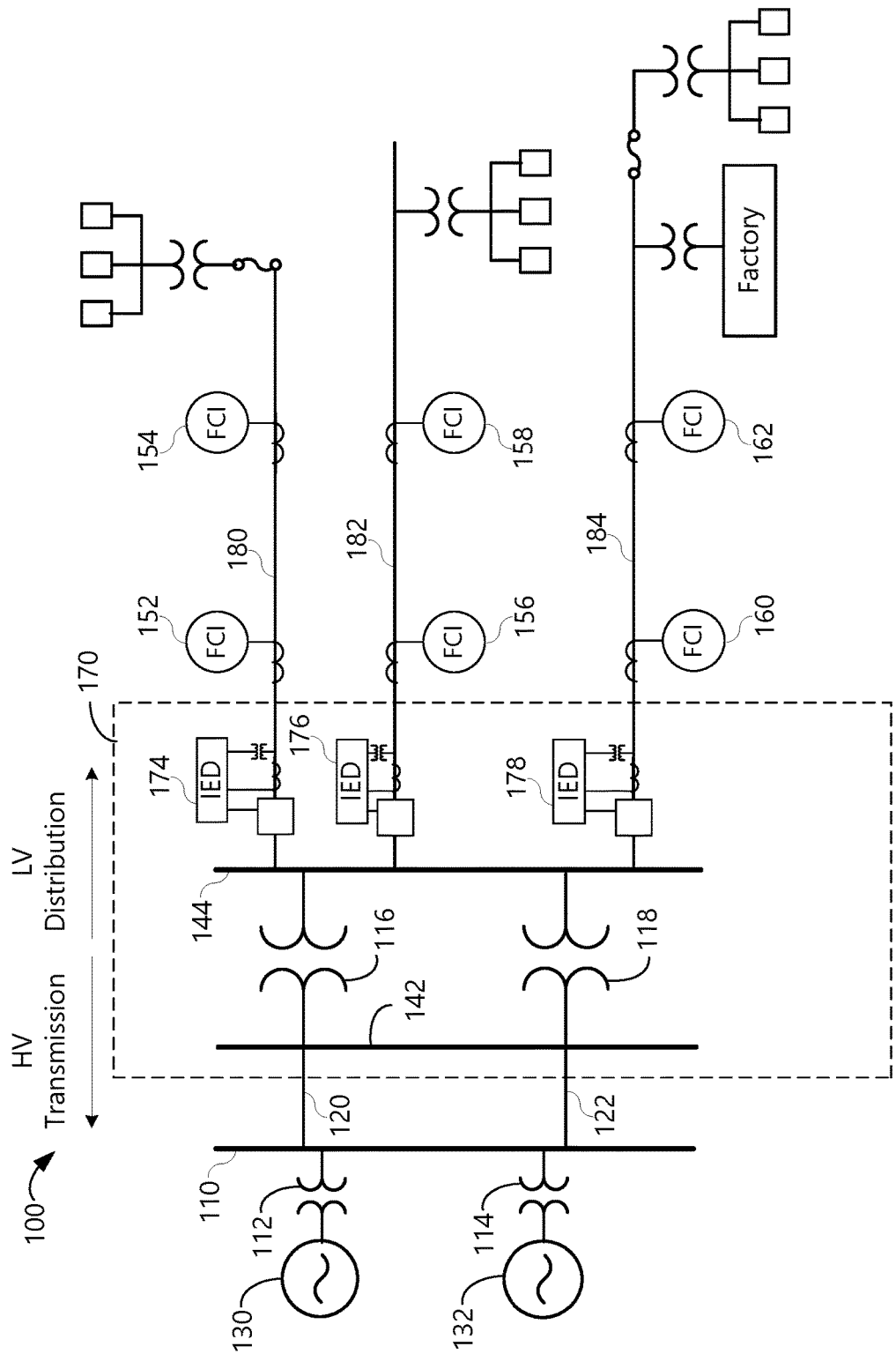
FIG. 1 illustrates a simplified one-line diagram of an electric power delivery system

Electric power delivery systems are used throughout the world to generate, transmit, and distribute electric power to loads for consumption. To monitor, protect, and automate the electric power delivery system and its equipment, intelligent electronic devices (IEDs) may be used to obtain and process information from the electric power delivery system, perform monitoring and protection functions, and effect control operations on the electric power delivery system equipment. Typically, IEDs are located at substations and near major equipment.

To improve the data gathering, monitoring, and protection of the electric power delivery system, line-mounted devices may be used to obtain electric power system measurements and provide measurements and information to IEDs and supervisory systems. Measurements and electric power delivery system information from line-mounted devices may be used by IEDs to improve monitoring and protection of the electric power delivery system. For example, a line-mounted device may obtain current measurements during a fault condition. The line-mounted device may detect the fault, and report the fault condition along with a fault magnitude to the IEDs or supervisory system. IEDs or the supervisory system may use fault magnitude to determine a more accurate fault location. Indeed, an IED may provide a better estimation of the fault location using a fault magnitude from a line-mounted device nearer to the fault than a fault magnitude obtained from the location of the IED.

Accordingly, what is needed is a line-mounted device that provides an accurate fault magnitude calculation to an IED to improve the accuracy of the fault location calculation. Furthermore, what is needed is a line-mounted device that provides accurate fault magnitude calculation during current transformer (CT) saturation. Also, what is needed is a line-mounted device that provides accurate fault magnitude calculation while reducing power consumed by the line-mounted device.

Line-mounted devices may obtain electric power current measurements from the line using CTs. CTs used be line-mounted devices may be constrained by requirements related to size, power consumption, weight, and the like. Accordingly, CTs used by line-mounted devices may saturate when the current exceeds the nominal current for the portion of the electric power delivery system where the line-mounted device is applied or when current approaches a fault current magnitude.

Accordingly, what is needed is a method to determine a current signal using the output of a saturated CT. Electric power system monitoring and protection is improved by the calculation of current signals using the output of a saturated CT. Furthermore, the accuracy of a fault location is improved by using a fault magnitude from a line-mounted device even under saturated CT conditions.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module.

Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system 100. Electric power may be generated by generation sites 130, 132, which supply electric power to a transmission bus 110 via transformers 112, 114. Electric power may be transmitted via transmission lines 120, 122 to bus 142 at substation 170. Transformers 116, 118 may reduce voltage of the electric power from bus 142 to distribution bus 144. Several feeders 180, 182, 184 may distribute electric power from distribution bus 144 to various loads.

Although not separately illustrated, various of the electric power delivery system equipment may be monitored or protected by various IEDs. For example, generators may be monitored and protected by generator IEDs. Transformers, buses, transmission lines, and the like may be monitored and protected by respective IEDs. Feeder 180 may be monitored and protected using IED 174, which obtains electric power signals from feeder 180 using CTs, PTs, and the like; and may effect control of the electric power system by control of a circuit breaker. Similarly, feeder 182 may be monitored and protected using IED 176, and feeder 184 may be monitored and protected using IED 178.

To improve the monitoring and protection of feeders 180, 182, and 184, line-mounted devices in the form of faulted circuit indicators (FCIs) 152, 154, 156, 158, 160, and 162 may be used on feeders 180, 182, and 184. FCIs may obtain electric power signals from feeders 180, 182, 184 using, for example, CTs. Upon obtaining electric power signals, FCIs may sample a secondary signal from CTs, determine a fault condition, determine a fault current magnitude, and transmit information such as current, fault current magnitude, and the like to IEDs 174, 176, and 178 according to the embodiments herein described.

Figure 2A:
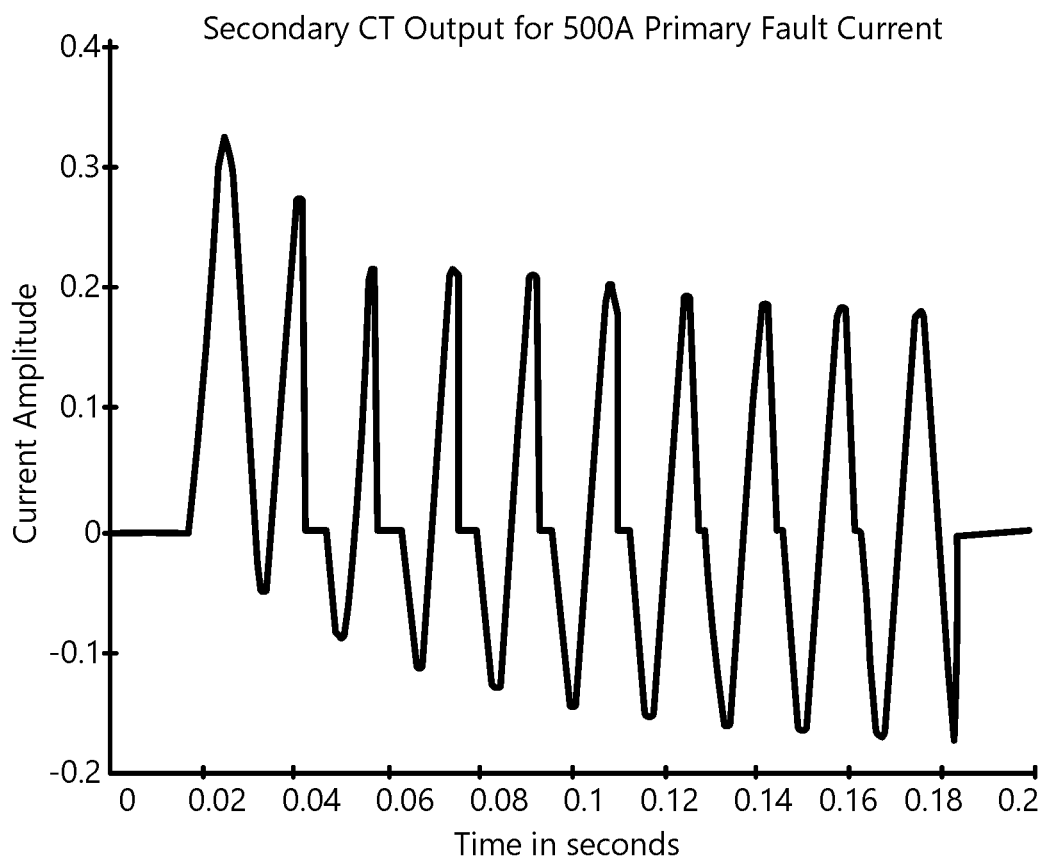
FIGS. 2A and 2B illustrate secondary current signals from a current transformer (CT) during saturation.
Figure 2B:
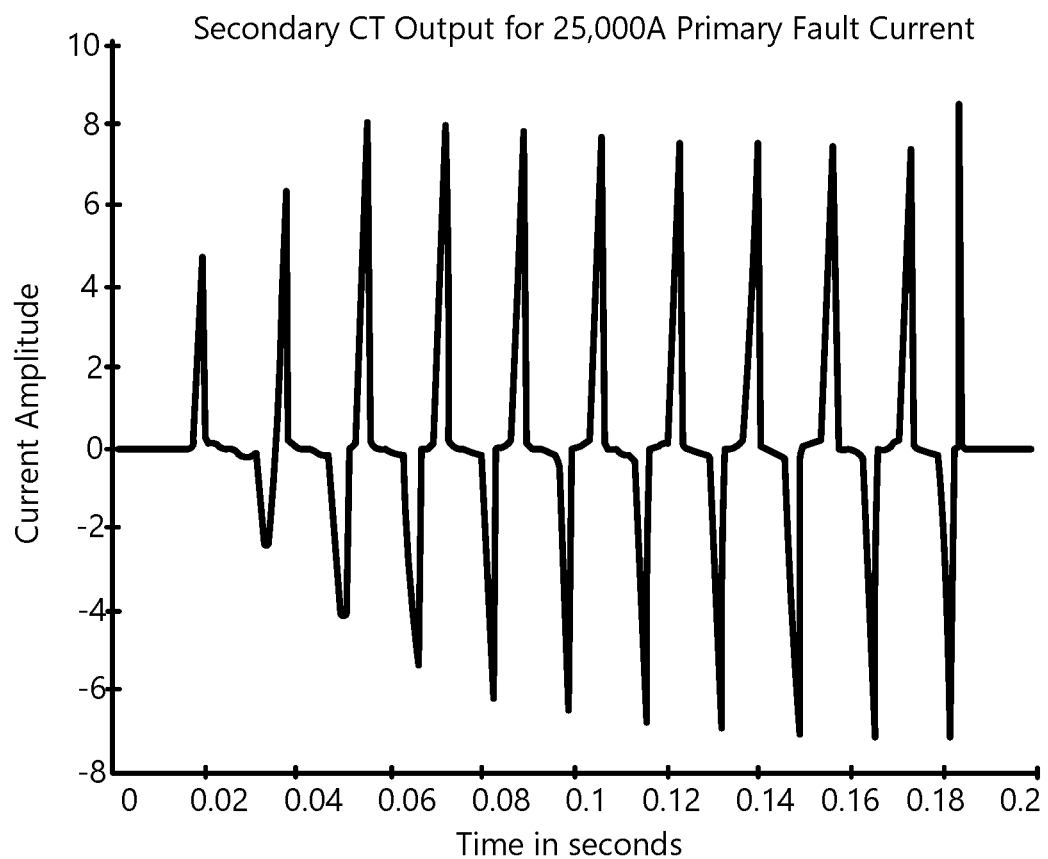

As suggested above, line-mounted devices often include CTs that may saturate under current conditions that exceed the nominal current condition of the electric power delivery system or approaches fault current magnitude. FIG. 2A illustrates a plot of a secondary current signal from a saturated CT of a line-mounted device during a 500A primary fault condition. As can be seen, the CT saturates leading to a distorted current signal. Similarly, FIG. 2B illustrates a plot of a secondary current signal from a saturated CT of a line-mounted device during a 25,000 A primary fault condition. The evidence of saturation of the CT is even more evident than the saturation illustrated in FIG. 2A given the distortion present in the secondary signal. Clearly, the sinusoidal current waveform is not represented by the current secondary from the saturated CT.

Figure 3:
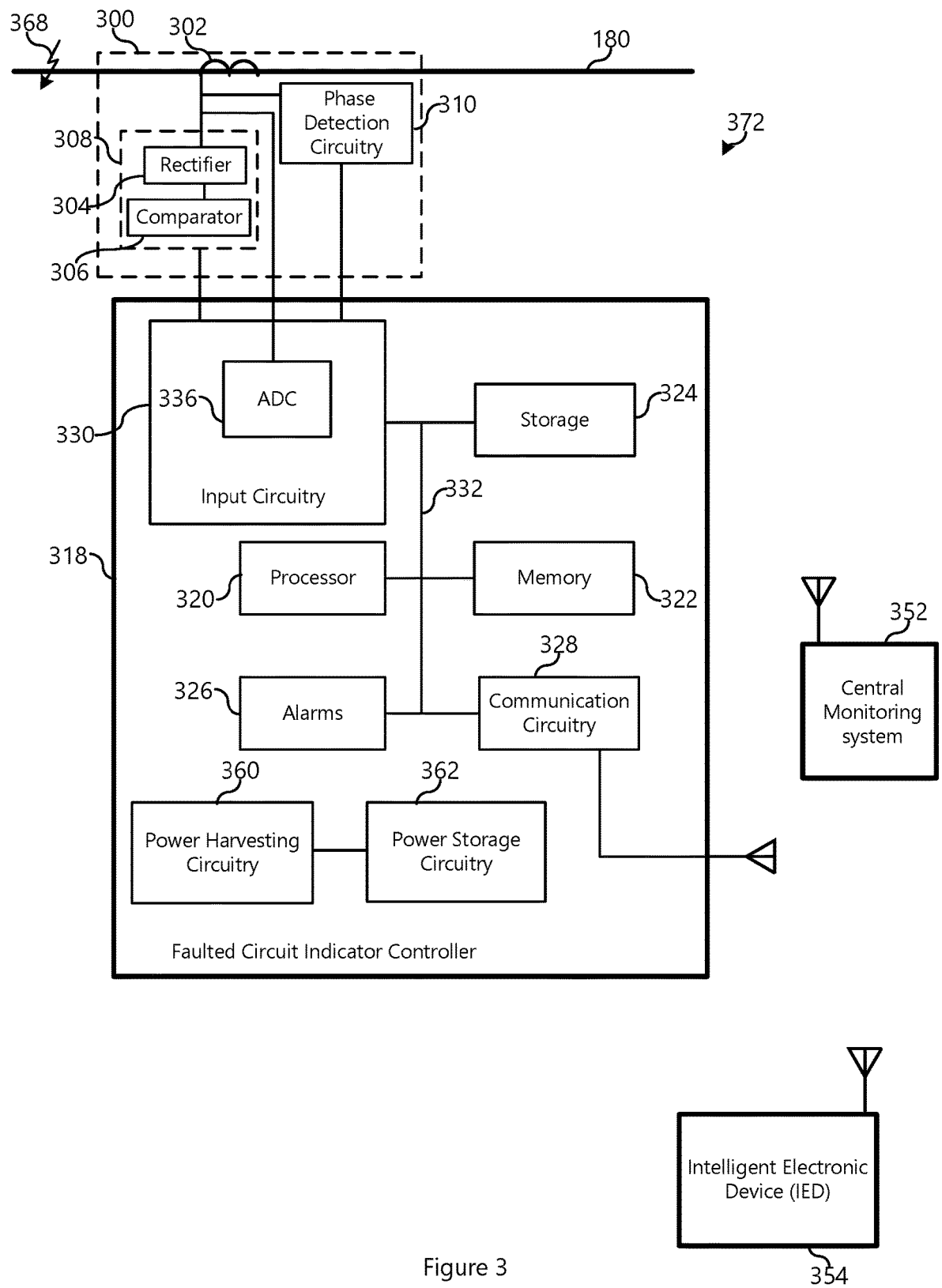
FIG. 3 illustrates a simplified block diagram of a line-mounted sensor according to several embodiments herein.

FIG. 3 illustrates a simplified block diagram of a line-mounted device 372 obtaining current measurements from feeder 180, and determine a fault current magnitude even under saturated CT conditions according to several embodiments herein. The line-mounted device 372 may refer to any of the line-mounted devices or FCIs 152, 154, 156, 158, 160, or 162 discussed above. The line-mounted device 372 may include sensor circuitry 300 configured to obtain a current signal from the feeder 180. The sensor circuitry 300 may include one or more CTs 302 operatively coupled to the feeder 180 such that current through the feeder 180 induces current through the CT 302 proportional to current through the feeder 180 under unsaturated conditions. The sensor circuitry 300 may further include threshold detection circuitry 308 and phase detection circuitry 310. The threshold detection circuitry 308 may have a rectifier 304 that rectifies the current signals from the CT 302 and a comparator 306 electrically coupled to an output of the rectifier 304. The comparator 306 may compare the rectified signal to a threshold to detect an occurrence of an event such as fault 368. As suggested herein, the CT may provide an accurate secondary current signal during nominal conditions but a distorted secondary current signal during saturated conditions (such as, for example, during an overcurrent condition).

The line sensor 372 may include a controller 318, such as a microcontroller, having one or more processor(s) 320, memory 322 and/or nonvolatile storage 324, one or more alarms 326, communication circuitry 328, input circuitry 330, or any combination thereof. Each of the processor 320, the memory 322, the storage 324, the alarms 326, the communication circuitry 328, and the input circuitry 330 may be communicatively coupled by one or more communication busses 332. In the illustrated embodiment, the input circuitry 330 may receive the output from the comparator 306. For example, the comparator 306 may output a digital signal to the input circuitry 330 based on the comparison between the threshold and the rectified signal to indicate the occurrence of the event 368.

In the illustrated embodiment, the line sensor 372 includes one or more analog to digital (A/D) converters 336 that receive an analog signal from the current transformer 302 or another current transformer and convert the analog signal into a digital signal. The A/D converter 336 may multiplex, sample, and/or digitize the measured current and/or voltage signals to form corresponding digitized current and/or voltage signals. For example, the A/D converter 336 may monitor an analog signal indicative of the operating parameter on the feeder 180 and output a digital signal representing the operating parameter on the feeder 180.

The processor 320 and/or other data processing circuitry may be operably coupled with the memory 322 and/or the nonvolatile storage 324 to perform various operations. Such programs or instructions executed by the processor 320 may be stored in any suitable article of manufacture that may include one or more tangible, computer-readable media at least collectively storing the instructions or routines, such as the memory 322 and the nonvolatile storage 324. The memory 322 and the nonvolatile storage 324 may include any suitable articles of manufacture for storing data and executable instructions, such as random-access memory, read-only memory, rewritable flash memory, hard drives, or any other suitable optical, magnetic, or solid-state storage medium, or a combination thereof.

In some embodiments, the processor 320, the memory 322, and/or the nonvolatile storage 324 may be implemented as hardware components, such as via discrete electrical components, via a field programmable gate array (FPGA), and/or via one or more application specific integrated circuits (ASICs). The processor 320 may be embodied as one or more general-purpose microprocessors, one or more special-purpose microprocessors, a general purpose integrated circuit, an ASIC, an FPGA, and/or other programmable logic devices.

The input circuitry 330, such as the A/D converter 336, may be operatively coupled to the processor 320 (e.g., via the communication bus 332 or another bus), through which digitized representations of current and/or voltage signals may be transmitted to the processor 320. The processor 320 may analyze the event 368 based on the digitized representations of current using instructions stored in the memory 322. The processor 320 may then provide a signal indicating the occurrence of the event 368. In certain embodiments, the processor 320 may send a signal to the alarm 326 to indicate the event 368 occurrence. The alarm 326 may provide an audio alert, a visual alert (e.g., LEDs), or the like. The processor 320 may send a signal to the communication circuitry 328 to output a wireless signal to an electronic device to indicate that the event 368 has occurred or is ongoing. In some embodiments, the communication circuitry 328 may include a transceiver that receives and/or transmits data to enable the processor 320 to communicate with other electronic devices. For instance, the processor 320 may communicate, via a communication network with a central monitoring system 352, such as a supervisory control and data acquisition (SCADA) system and/or a wide area control and situational awareness (WACSA) system. The central monitoring system 352 may provide protective operations for the power transmission and distribution system.

The processor 320 may communicate, via a communication network and/or via direct radio signals sent by the transceiver, with one or more intelligent electronic devices (IEDs) 354. The IED 354 may be remote from the central monitoring system 352 and may communicate directly or over the communication network with the central monitoring system 352 and/or one or more other IEDs.

In certain embodiments, the line-mounted device 372 may communicate via radio signals with an intermediary device which transmits information to IEDs, SCADA, WACSA, or similar monitoring systems. An intermediate device may be in radio communication with several line-mounted devices, and transmit information therefrom to IEDs, SCADA, WACSA, or similar monitoring systems.

The line sensor 372 may include power harvesting circuitry 360 (e.g., current transformers coupled to the power line 358, photovoltaic cells, etc.) and/or power storage circuitry 362 (e.g., battery cells, capacitors, supercapacitors, and the like) to store, for example, the harvested energy. Electric power for the energy harvesting circuitry 360 may be obtained using CT 302. The power harvesting circuitry 360 and/or the power storage circuitry 362 may provide power to the line sensor 372 to enable the line sensor 372 to monitor the feeder 180 and provide an indication of the event 368.

The line sensor 372 may be a wireless line sensor that is powered with the power harvesting circuitry 360 and/or the power storage circuitry 362. The power harvesting circuitry 360 of wireless line sensors may be limited in which the line sensor 372 is powered via the current transformer 302 or another current transformer without being directly electrically coupled to the power grid. That is, alternating current on the feeder 180 may produce a magnetic field that magnetically induces alternating current in the current transformer 302 (e.g., through a core), harvested by the power harvesting circuitry 360, to power each of the operations of line sensor 372 without additional sources of power other than the power harvesting circuitry 360 and/or the power storage circuitry 362 (e.g., without directly conducting electrical energy via a conductor directly electrically coupled to the power grid). In other embodiments, the power harvesting circuitry 360 may harvest power via photovoltaic cells. The power storage circuitry 362 may include one or more battery cells, capacitors, supercapacitors, or the like, to store energy from the power harvesting circuitry 360 to power the line sensor 372. In some embodiments, the line sensor 372 may perform each of the operations described herein using power from the power harvesting circuitry 360 and/or power storage circuitry 362 without additional power sources.

Because power to perform operations may be limited on the line sensor 372 based on the power harvesting circuitry 360 and/or the power storage circuitry 362, it may be desirable for the line sensor 372 to conserve power. Line sensors that continuously monitor samples (e.g., sampling 3, 4, 5, 10, 20, or more samples within a period) of the current during normal operation may utilize significant power. As described below, embodiments consistent with the present disclosure may improve line sensor technology by determining a fault and fault current magnitude of the event without continuously monitoring the current during normal operations (e.g., operations prior to or without an event). By determining a fault current magnitude of the event while limiting power consumption, additional functionality of the wireless line sensor technology may be enabled in which the line sensor 372 provides or stores an indication of the event.

The phase detection circuitry 310 may monitor a feature of the operating parameter, such as changes in the current or voltage. In the illustrated embodiment, the phase detection circuitry 310 may monitor a time at which a feature, such as a zero crossing of the current, a zero crossing of the voltage, a peak (e.g., maximum and/or minimum) of the current, or a peak (e.g., maximum and/or minimum) of the voltage, occurs.

The phase detection circuitry 310 may send an activation signal to activate (e.g., wake up) the controller 318 to enable the controller 318 to store a time stamp associated with each zero crossing. For example, the phase detection circuitry 310 may activate, via hardware interrupts, the controller 318 at each rising edge (e.g., from negative phase to positive phase) and/or falling edge (e.g., from positive phase to negative phase). Upon activation, the controller 318 may record a time stamp associated with the rising edge and/or falling edge and be deactivated until reactivated.

Prior to the event, the controller 318 may be in a sleep mode or in a low power mode, referred to herein as being in a pre-event mode, in which the controller 318 may not measure samples of the magnitude of the current on the feeder 180 to conserve power. That is, the controller 318 may be activated to record time stamps of the zero crossing but may not sample the magnitude of the current or may otherwise be inactive in the pre-event mode. For instance, by being activated to record the time stamps of zero crossings (e.g., awake 60 times per second for a 60 hz signal). For example, the controller 318 may begin in an inactive state. Upon occurrence of a zero crossing, the phase detection circuitry 310 may send the activation signal to the controller 318 to activate the controller 320. The processor 320 may record a time stamp of the zero crossing based upon the activation signal and return to being inactive. The controller 318 may repeat this process while operating in the pre-event mode to conserve power by the controller 318 being inactive other than during the zero crossings.

The controller 318 may receive an event signal from the threshold detection circuitry 308 indicating the occurrence of the event 368 due to current exceeding a threshold. The controller 318 may activate upon receiving the event signal and operate in an event mode in which the controller 318 is active, awake, on, or in a high power mode that utilizes more power than the low power mode (e.g., due to being active for longer periods than when active in the pre-event mode) prior to the event. The controller 318 may then measure samples of the current of the feeder 180. In some embodiments, the controller 318 may measure repeated samples (e.g., 8, 16, 32, or more samples), in the event mode, during or following the event 368 to analyze the event 368. That is, the controller 318 may not take any samples of current magnitude prior to the event 368 but may be active to record zero crossings and, upon receipt of the event signal, transition to the event mode and take repeated samples. In other embodiments, the controller 318 may take fewer samples prior to the occurrence of the event 368 than during the occurrence of the event 368. Further, the processor 320 may determine the times at which the zero crossings occurred from the activations by the phase detection circuitry 310 and store the times in the memory 322 and/or nonvolatile storage 324. Based on the zero crossings prior to the event 368 and the repeated samples during or following the event 368, the processor 320 may determine a fault current magnitude of the event 368 even without samples obtained prior to the event, and even under saturated CT conditions.

Figure 4:
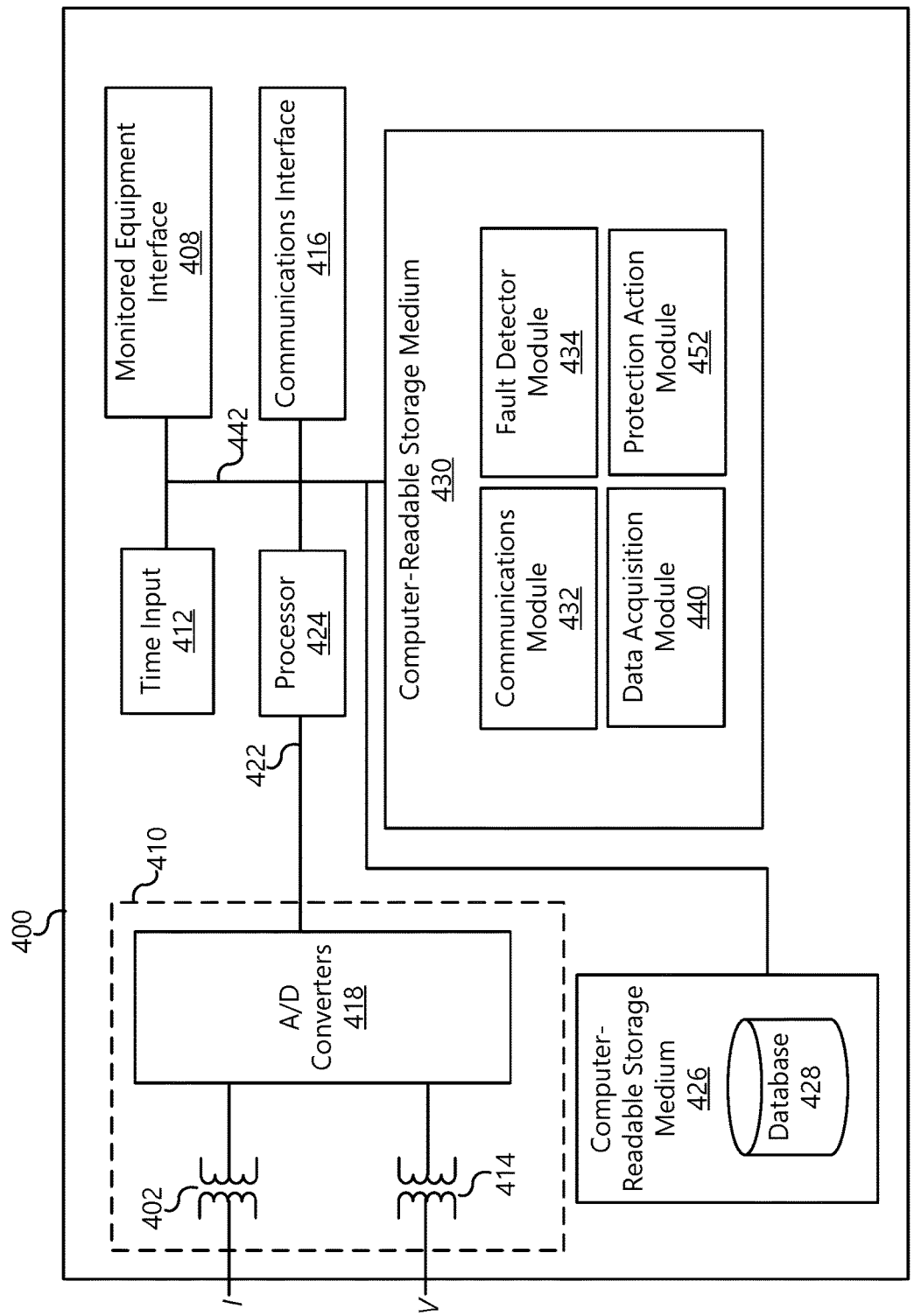
FIG. 4 illustrates a simplified functional block diagram of an intelligent electronic device (IED) in accordance with several embodiments herein.

FIG. 4 illustrates a simplified block diagram of an IED 400 for monitoring or protecting at least a portion of the electric power delivery system. Any of IEDs 174, 176, 178 of FIG. 1 may be configured similarly to IED 400. As has been suggested above, IED 400 may be configured to obtain electric power system signals from equipment of the electric power delivery system.

IED 400 includes a communications interface 416 configured to communicate with devices (such as line-mounted devices or intermediary devices) and/or IEDs. In certain embodiments, the communications interface 416 may facilitate direct communication with devices and other IEDs or communicate with systems over a communications network. According to various embodiments, the communications interface 416 may be configured to communicate via radio communications, and include an antenna for radio communications. IED 400 may further include a time input 412, which may be used to receive a time signal (e.g., a common time reference) allowing IED 400 to apply a time-stamp to the acquired samples. In certain embodiments, a common time reference may be received via communications interface 416, and accordingly, a separate time input may not be required for time-stamping and/or synchronization operations. One such embodiment may employ the IEEE 1588 protocol.

A monitored equipment interface 408 may be configured to receive status information from, and issue control instructions to, a piece of monitored equipment (such as a circuit breaker, conductor, transformer, or the like). In various embodiments, IED 400 may be configured to effect a control or protection operation on an electric power delivery system using the monitored equipment interface 408. Upon detection of an event, the IED 400 may be configured to issue a signal to the monitored equipment to perform a function via the monitored equipment interface 408. For example, upon detection of a fault within a zone of protection of the IED 400, the IED may signal a circuit breaker to open to remove electric power from a portion of the electric power delivery system.

Processor 424 may be configured to process communications received via communications interface 416, time input 412, and/or monitored equipment interface 408. Processor 424 may operate using any number of processing rates and architectures. Processor 424 may be configured to perform various algorithms and calculations described herein. Processor 424 may be embodied as a general purpose integrated circuit, an application specific integrated circuit, a field-programmable gate array, and/or any other suitable programmable logic device.

In certain embodiments, IED 400 may include a sensor component 410. In the illustrated embodiment, sensor component 410 is configured to gather data directly from conventional electric power system equipment such as a conductor (not shown) using conventional PTs and/or CTs. The sensor component 410 may use, for example, transformers 402 and 414 and A/D converters 418 that may sample and/or digitize filtered waveforms to form corresponding digitized current and voltage signals provided to data bus 422. Current (I) and voltage (V) inputs may be secondary inputs from conventional instrument transformers such as, CTs and VTs. A/D converters 418 may include a single A/D converter or separate A/D converters for each incoming signal. A current signal may include separate current signals from each phase of a three-phase electric power system. A/D converters 418 may be connected to processor 424 by way of data bus 422, through which digitized representations of current and voltage signals may be transmitted to processor 424. In various embodiments, the digitized current and voltage signals may be used to calculate time-domain quantities for the detection and the location of a fault on an electric power system as described herein.

A computer-readable storage medium 426 may be the repository of a database 428 containing electric power line properties for each transmission line and/or each section of each transmission line, such as impedances, resistances, propagation times, reactances, lengths, and/or the like. Another computer-readable storage medium 430 may be the repository of various software modules configured to perform any of the methods described herein. A data bus 442 may link monitored equipment interface 408, time input 412, communications interface 416, and computer-readable storage mediums 426 and 430 to processor 424.

Computer-readable storage mediums 426 and 430 may be separate mediums, or may be the same medium (i.e. the same disk, the same non-volatile memory device, or the like). Further, the database 428 may be stored in a computer-readable storage medium that is not part of the IED 400, but that is accessible to IED 400 using, for example, communications interface 416.

Communications module 432 may be configured to allow IED 400 to communicate with any of a variety of external devices via communications interface 416. Communications module 432 may be configured for communication using a variety of data communication protocols (e.g., UDP over Ethernet, IEC 61850, etc.).

Data acquisition module 440 may collect data samples such as the current and voltage quantities and the incremental quantities. The data samples may be associated with a timestamp and made available for retrieval and/or transmission to a remote IED via communications interface 416. Data acquisition module 440 may operate in conjunction with fault detector module 434. Data acquisition module 440 may control recording of data used by the fault detector module 434. According to one embodiment, data acquisition module 440 may selectively store and retrieve data and may make the data available for further processing. Such processing may include processing by fault detector module 434, which may be configured to determine the occurrence of a fault with an electric power distribution system.

A protective action module 452 may be configured to implement a protective action based on the declaration of a fault by the fault detector module 434. In various embodiments, a protective action may include tripping a breaker, selectively isolating a portion of the electric power system, etc. In various embodiments, the protective action module 452 may coordinate protective actions with other devices in communication with IED 400.

As is illustrated and described, line-mounted devices may be installed in a somewhat distributed manner on conductors in an electric power delivery system. The line-mounted devices may monitor current on the conductor, determine current levels, determine fault conditions, and communicate such information back to an IED or supervisory system either directly or indirectly through intermediary devices, communication networks, and the like. Furthermore, line-mounted devices may be configured to operate using electric power harvested from the conductor, onboard power sources, or the like. To conserve electric power for operation, the line-mounted device may be configured to reduce the amount of electric power used by its various components. To that end, the line-mounted device may be configured to operate with the processor in a low-power mode unless certain conditions are detected. As illustrated in FIG. 3, the line-mounted device may use sensor circuitry to determine phase, compare current magnitude to a threshold, filter the current signal, and the like. The processor 320 may be activated to record time stamps of zero crossings determined by the phase detection circuitry 310. The processor 320 may be activated upon determination of a fault condition by the comparator 306, at which time the processor may be active to record sampled current signals, determine fault conditions, determine a direction to the fault, determine a fault magnitude, effect communication, and the like. Otherwise, the processor 320 may remain in low-power or pre-event mode without continuously sampling the current signal.

Figure 5:
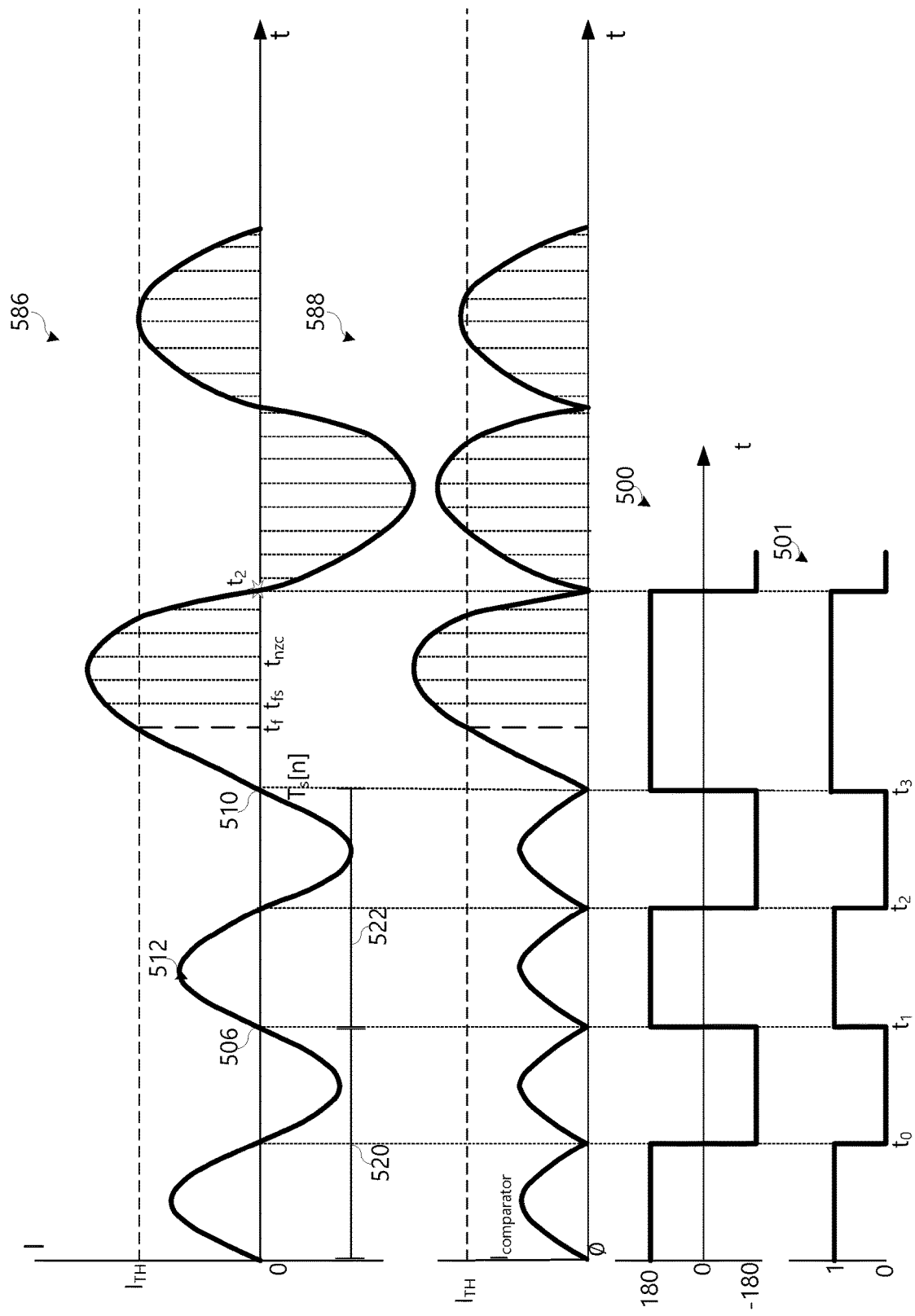
FIG. 5 illustrates current and data plots in accordance with several embodiments herein.

FIG. 5 illustrates plots of signals during different time periods and stages of a line-mounted device. The set of graphs in are meant to be illustrative of concepts consistent with embodiments of the disclosure, and while the graphs are depicted visually, the line sensor 372 may process data from the sensor circuitry 300 and/or the phase detection circuitry 310 without generating the visual depiction of the graphs.

A first graph 586 shows current measurements obtained at the current sensor circuitry 300 representative of current through the power line 180 with respect to time. A second graph 588 illustrates the rectified current obtained at the comparator 306 to detect the occurrence of the event 368. A third graph 500 shows a signal analyzed via the phase detection circuitry 310 used to activate the controller 318 to obtain the time stamps of the zero crossings. A fourth graph 501 shows an activation signal sent from the phase detection circuitry 310 to the controller 318 to record the time stamps of the zero crossings. The phase detection circuitry 310 may detect the times at which the phase alternates directions at time stamps $t_0$, $t_1$, $t_2$, and $t_3$. Each of the time stamps $t_0$, $t_1$, $t_2$, and $t_3$ may be stored in memory 322 and/or the nonvolatile storage 324 the controller 318. In an embodiment, the phase detection circuitry 310 may send the activation signal to activate the controller 318 at each rising edge at time $t_1$ and $t_3$. In another embodiment, the phase detection circuitry 310 may send the activation signal to activate the controller 318 at each falling edge at time $t_0$ and $t_2$.

In the illustrated embodiment, upon detecting that the current exceeds the threshold, the line-mounted device may detect an overcurrent fault, and determine the fault magnitude for transmission to an IED or supervisory system such that additional aspects of the fault may be determined. As described above, the CT may become saturated, such that the fault magnitude cannot be measured directly using the secondary signals therefrom. To determine the fault magnitude even during CT saturation, the line-mounted device may: 1) time stamp zero crossing of the pre-event current and determine the power system period and frequency; 2) when the current magnitude exceeds a predetermined threshold, time stamp the instant that the threshold is crossed, and start sampling the current; 3) calculate the first maximum peak and minimum peak of the sampled waveform; 4) find the maximum or minimum peaks (depending on step 3) and find the unsaturated region of samples depending on the maximum or minimum peaks; 5) determine data pairs of samples within the unsaturated regions in consecutive cycles; 6) determine direct current (DC) component parameters; 7) remove DC components from the samples; and 8) determine the fault magnitude with the DC components removed.

The processor 320 may retrieve the time stamps $t_1$ and $t_3$ of rising zero crossings of the pre-event current 512 from the memory 322 and/or the non-volatile storage 324. The processor 320 may determine a period (or frequency) 520 and 522 of the pre-event current 512 based on the time stamps $t_1$ and $t_3$ the rising edge zero crossings 506, and 510. In an embodiment, the processor 320 may utilize a moving average filter to determine the period 520 and 522. For example, a low pass filter (which may be implemented in the processor 320, or may be implemented in hardware in, for example, the input circuitry 330) having a moving average of time between each of the rising zero crossings may be implemented according to Equation 1:

$$T_{average}[n] = \frac{1}{4}(t_s[n] - t_s[n-4])$$ Eq. 1

$$f = \frac{1}{T_{average}[n]}$$

where $t_s$ represents the time stamps of the rising edge zero crossings of the nth sample. Note that while rising edge zero crossings are used as an example, falling edge or a combination of both may be used.

At time $t_f$, the sensor circuitry 300 may detect an occurrence of the event 368 by determining that measured current has exceeded a current threshold ($I_{TH}$). Upon determining that the measured current exceeds $I_{TH}$, the sensor circuitry 300 may send the event signal to the controller 318 to activate the controller 318 to operate in the event mode from operating in the pre-event mode. The processor 320 may begin repeatedly sampling the fault current for one or more cycles (e.g., 2.5 cycles, 3 cycles, 5 cycles, 6 cycles, 10 cycles, etc.). The processor 320 may obtain the first sample at time $t_{fs}$ according to Equation 2:

$$t_{fs} = t_s[n] + m_{min} * \frac{T_{average}[n]}{N} \qquad \text{Eq. 2}$$

where $t_s[n]$ is the last time stamp of the zero crossing of current prior to the event;

N is the total number of samples per cycle;

$T_{average}[n]$ is derived from equation (1); and, $m_{min}$ is the smallest integer number in which $t_f < t_{fs}$ where $t_f$ refers to the time at which the current threshold is exceeded.

The sampling frequency ($f_{samp}$) selected may depend on the period to obtain a given number of samples per cycle.

TABLE 1

Example sampling frequencies ($f_{samp}$).

| Frequency range (Hz) | | Period range (ms) | | Sampling frequency for 8 samples per cycle (kHz) | Sampling frequency for 16 samples per cycle (kHz) | Sampling frequency for 32 samples per cycle (kHz) |
|---|---|---|---|---|---|---|
| 64.75 | 65.25 | 15.44 | 15.33 | 0.522 | 1.044 | 2.088 |
| 64.25 | 64.75 | 15.56 | 15.44 | 0.518 | 1.036 | 2.072 |
| 63.75 | 64.25 | 15.69 | 15.56 | 0.514 | 1.028 | 2.056 |
| 63.25 | 63.75 | 15.81 | 15.69 | 0.51 | 1.02 | 2.04 |
| 62.75 | 63.25 | 15.94 | 15.81 | 0.506 | 1.012 | 2.024 |
| 62.25 | 62.75 | 16.06 | 15.94 | 0.502 | 1.004 | 2.008 |
| 61.75 | 62.25 | 16.19 | 16.06 | 0.498 | 0.996 | 1.992 |
| 61.25 | 61.75 | 16.33 | 16.19 | 0.494 | 0.988 | 1.976 |
| 60.75 | 61.25 | 16.46 | 16.33 | 0.49 | 0.98 | 1.96 |
| 60.25 | 60.75 | 16.60 | 16.46 | 0.486 | 0.972 | 1.944 |
| 59.75 | 60.25 | 16.74 | 16.60 | 0.482 | 0.964 | 1.928 |
| 59.25 | 59.75 | 16.88 | 16.74 | 0.478 | 0.956 | 1.912 |
| 58.75 | 59.25 | 17.02 | 16.88 | 0.474 | 0.948 | 1.896 |
| 58.25 | 58.75 | 17.17 | 17.02 | 0.47 | 0.94 | 1.88 |
| 57.75 | 58.25 | 17.32 | 17.17 | 0.466 | 0.932 | 1.864 |
| 57.25 | 57.75 | 17.47 | 17.32 | 0.462 | 0.924 | 1.848 |
| 56.75 | 57.25 | 17.62 | 17.47 | 0.458 | 0.916 | 1.832 |
| 56.25 | 56.75 | 17.78 | 17.62 | 0.454 | 0.908 | 1.816 |
| 55.75 | 56.25 | 17.94 | 17.78 | 0.45 | 0.9 | 1.8 |
| 55.25 | 55.75 | 18.10 | 17.94 | 0.446 | 0.892 | 1.784 |
| 54.75 | 55.25 | 18.26 | 18.10 | 0.442 | 0.884 | 1.768 |

For example, a sampling frequency for a system frequency between 59.75 Hz and 60.25 Hz (i.e., a period of approximately 16.60 ms to 16.74 ms) with 8 samples per cycle may have a sampling frequency of approximately 0.482 kHz. While the table provides example sampling frequencies, these are simply meant to be illustrative and any suitable sampling frequency may be used.

The sequence of sampled values at the chosen frequency {Sm} may refer to:

$$s_m = s\left(t_{fs} + m\frac{T_{average}[n]}{N}\right) \qquad \text{Eq. 3}$$

where m is the integer sample (e.g., m=0, 1, 2, . . . ).

Figure 6:
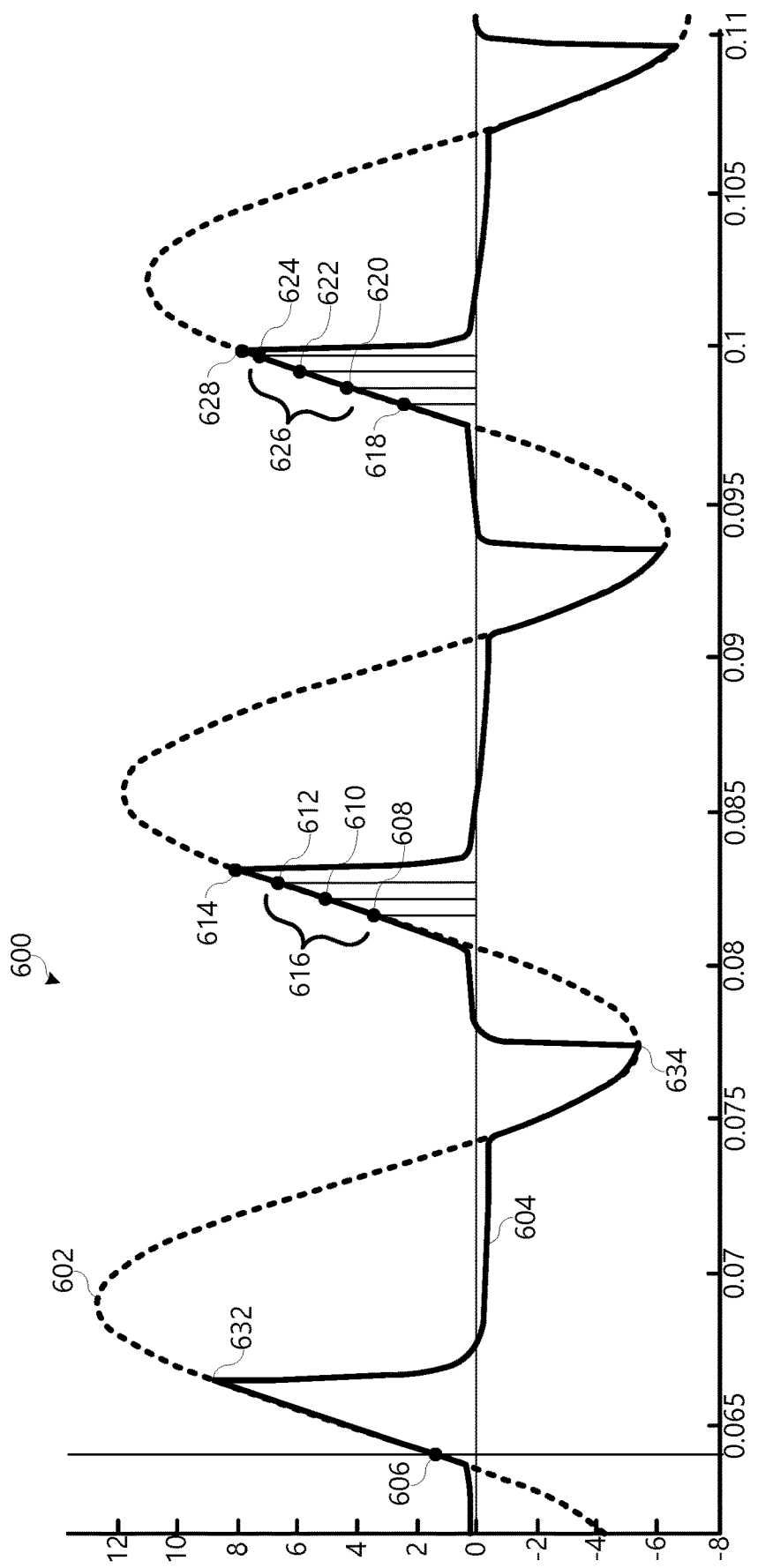
FIG. 6 illustrates a current signal from a saturated CT along with points useful for determining current measurements in accordance with several embodiments herein.

With the sequence of sampled values, the processor may calculate the first maximum peak and minimum peak values of the sampled waveform. FIG. 6 illustrates a current waveform 600 captured by a line-mounted device with a CT that has been saturated by an overcurrent condition. As can be seen, a secondary current without a saturated CT would appear as trace 602. However, due to the CT saturation, the measured secondary current is represented by trace 604. At point 606 an overcurrent condition is detected, the processor enters active mode, and sampling begins. Maximum peak 632 is determined, as is minimum peak 634. The line-mounted device will use samples from either the maximum peaks or minimum peaks depending on the magnitudes thereof. If the first maximum peak has a magnitude greater than that of the first minimum peak, then samples of the maximum peaks will be used. If the first minimum peak has a magnitude greater than that of the first maximum peak, then minimum peaks will be used. In the illustrated embodiment, the first maximum peak has a magnitude greater than the magnitude of the first minimum peak, so the line-mounted device will use samples of the maximum peaks.

The line mounted device may then find the maximum peak values for at least two of the maximum peaks. As illustrated, peaks 614 and 628 are determined as the first two maximum peaks. In the illustrated example, the first illustrated peak 632 may be ignored because the sampling thereof did not start until the current exceeded the threshold at 606. However, various embodiments may include such a first observed peak. The peak samples may be denoted as $S_{m1}$ (614), $S_{m2}$ (628), $S_{m3}$, $S_{m4}$, $S_{m5}$, and so forth.

From the peak values, the samples closest to, for example, 90% of the peak value are found, and referred to herein as unsaturated endpoints. The unsaturated endpoints may be denoted as $n_{me1}$ (612), $n_{me2}$ (624), $n_{me3}$, $n_{me4}$, $n_{me5}$, and so forth. From the peak values, the samples closest to, for example, 50% of the peak value are found, and referred to herein as unsaturated starting points. The unsaturated starting points may be denoted as $n_{ms1}$ (608), $n_{ms2}$ (620), $n_{ms3}$, $n_{ms4}$, $n_{ms5}$, and so forth. The unsaturated starting points and unsaturated endpoints are used to determine the unsaturated regions of the CT. As illustrated the unsaturated region of the first peak includes the region 616 from unsaturated starting point 608 to unsaturated endpoint 612; and the unsaturated region of the second peak includes the region 626 from unsaturated starting point 620 to unsaturated endpoint 624.

It should be understood that the unsaturated region may be determined using different starting points and endpoints. In one embodiment, the unsaturated endpoints are determined as the sample closest to 95% of the peak value. In another embodiment, the unsaturated starting points are determined as the sample closest to 40% of the peak value. Indeed, different combinations of the starting point and endpoint values may be used. For example, an embodiment may use the sample closet to 40% of the peak value for the starting point and the sample closest to 90% of the peak value for the endpoint. Furthermore, different starting point and endpoint values may be used for different peaks of the waveform. For example, in one embodiment, the unsaturated region of the first peak may be determined with a starting point as the sample closest to 50% of the first peak value and an endpoint as the sample closest to 90% of the first peak value; where the unsaturated zone of the second peak may be determined with a starting point as the sample closest to 40% of the second peak value and an endpoint as the sample closest to 95% of the second peak value.

With the unsaturated regions determined, valid data pairs may be selected. A valid data pair is a pair of data points in consecutive cycles, separated by the number of samples per cycle (N) that are each within the respective unsaturated region. That is, a valid pair meets the following criteria: 1) separated by N samples; and 2) each sample in the pair is within its unsaturated region. In the illustrated example, one pair includes points 612 and 622 because the two points are separated by N samples, and each is within its unsaturated region (616, 626). Another pair includes points 610 and 620, as these are separated by N samples, and each are within its unsaturated region (616, 626). However, pair 608 and 618 are not a valid par because, although they are separated by N samples, point 618 is not within its unsaturated region, 626, so the pair is not valid. Accordingly, in the example illustrated in FIG. 6, two pairs are found.

According to several embodiments herein, at least two pairs in consecutive cycles are needed to determine the fault magnitude. As the pairs can come from any consecutive cycles, if the first two cycles do not yield at least two pairs, data samples from additional consecutive cycles may be used. For example, samples from the second and third cycle may be examined to determine if at least two valid pairs are found. Similar determinations may be made for subsequent cycles if needed. It should be noted that by increasing the number of samples per cycle (N), more pairs will be available in each unsaturated region. This will increase the likelihood that at least two valid pairs will be found. For purposes of examples herein, the first set of at least two valid pairs is denoted as $N_{pairs}$. Furthermore, if additional pairs are needed to provide sufficient valid pairs, additional sample points may be calculated by interpolating between recorded sample points in the unsaturated regions.

With at least two valid pairs determined, the pairs of samples may be used to calculate DC components of the saturated signal and to calculate the fault magnitude. This calculation may depend on the number of valid pairs found. If the number of valid pairs is 2 ($|N_{pairs}|=2$), then Equations 3 and 4 may be used to determine $M_1$ and $M_2$:

$$M_1 = \begin{bmatrix} 1 & 1 \\ 1 & 2 \end{bmatrix} \quad \text{Eq. 4}$$

$$M_2 = \begin{bmatrix} \cos(2\pi fT) & \sin(2\pi fT) \\ \cos(2*2\pi fT) & \sin(2*2\pi fT) \end{bmatrix} \quad \text{Eq. 5}$$

where:

$$T = \frac{1}{Nf_{sample}}$$

is the sampling interval;

$M_1$ is a DC component parameter matrix; and, $M_2$ is a fault current magnitude matrix.

For the case with two valid pairs, the two data points may be denoted as $N_{pairs}=\{n_1, n_2\}$. The DC component parameters may be calculated using Equations 6-8:

$$S[n] = s[n] - s[n+N] \text{ if maximum peaks are used} \quad \text{Eq. 6A}$$

$$S[n] = s[n+N] - s[n] \text{ if minimum peaks are used} \quad \text{Eq. 6B}$$

-continued $$S_{M1} = \begin{bmatrix} \text{Ln}(S[n_1]) \\ \text{Ln}(S[n_2]) \end{bmatrix} \quad \text{Eq. 7}$$

$$D_c = \begin{bmatrix} D_{c1} \\ D_{c2} \end{bmatrix} = (M_1^T M_1)^{-1} M_1^T S_{M1} \quad \text{Eq. 8}$$

The DC fault current component can then be calculated using Equation 9:

$$S_{Dc}[n] = \lambda e^{n\alpha} \quad \text{Eq. 9}$$

where:

$\alpha = D_{C2}$;

$$\lambda = \frac{e^D C1}{1 - e^{N\alpha}}$$

if maximum peaks are used; and, $$\lambda = \frac{e^D C1}{e^{N\alpha} - 1}$$

if minimum peaks are used.

However, if the number of valid pairs is 3 ($|N_{pairs}|=3$), then Equations 10 and 11 may be used to determine $M_1$ and $M_2$:

$$M_1 = \begin{bmatrix} 1 & 1 \\ 1 & 2 \\ 1 & 3 \end{bmatrix} \quad \text{Eq. 10}$$

$$M_2 = \begin{bmatrix} \cos(2\pi fT) & \sin(2\pi fT) \\ \cos(2*2\pi fT) & \sin(2*2\pi fT) \\ \cos(3*2\pi fT) & \sin(3*2\pi fT) \end{bmatrix} \quad \text{Eq. 11}$$

Following the same pattern as in the case of two valid pairs, the three data points may be denoted as $N_{pairs}=\{n_1, n_2, n_3\}$. The DC component parameters may be calculated using Equation 8, and the DC fault current component may be calculated using Equation 9, with $S_{M1}$ may be calculated using Equation 12:

$$S_{M1} = \begin{bmatrix} \text{Ln}(S[n_1]) \\ \text{Ln}(S[n_2]) \\ \text{Ln}(S[n_3]) \end{bmatrix} \quad \text{Eq. 12}$$

Furthermore, if the number of valid pairs is 4 ($|N_{pairs}|=4$), then Equations 13 and 14 may be used to determine $M_1$ and $M_2$:

$$M_1 = \begin{bmatrix} 1 & 1 \\ 1 & 2 \\ 1 & 3 \\ 1 & 4 \end{bmatrix} \quad \text{Eq. 13}$$

-continued $$M_2 = \begin{bmatrix} \cos(2\pi fT) & \sin(2\pi fT) \\ \cos(2*2\pi fT) & \sin(2*2\pi fT) \\ \cos(3*2\pi fT) & \sin(3*2\pi fT) \\ \cos(4*2\pi fT) & \sin(4*2\pi fT) \end{bmatrix} \quad \text{Eq. 14}$$

Following the same pattern as in the case of two valid pairs, the four data points may be denoted as $N_{pairs}=\{n_1, n_2, n_3, n_4\}$. The DC component parameters may be calculated using Equation 8, and the DC fault current component may be calculated using Equation 9, with $S_{M1}$ may be calculated using Equation 15:

$$S_{M1} = \begin{bmatrix} \text{Ln}(S[n_1]) \\ \text{Ln}(S[n_2]) \\ \text{Ln}(S[n_3]) \\ \text{Ln}(S[n_4]) \end{bmatrix} \quad \text{Eq. 15}$$

It should be noted that more valid data pairs may be used, where the DC component parameters and DC fault current components may be calculated following the same pattern as has been described above.

With the DC fault current component, the DC component may be removed from the original samples to obtain a sinusoidal part of the original sampled secondary current signal using Equation 16:

$$s_{Ac}[n]=s[n]-s_{Dc}[n] \quad \text{Eq. 16}$$

where $S_{AC}[n]$ represents the original samples with the DC component removed.

Upon obtaining samples with the DC component removed, the fault current magnitude may be calculated. In one embodiment, the sinusoidal waveform ($A_C$) may be calculated in Equations 17 and 18, using the fault current magnitude matrix $M_2$ from the above Equations 5, 11, and 14, depending on the number of valid pairs:

$$S_{M2} = \begin{bmatrix} S_{Ac}[n_1] \\ S_{Ac}[n_2] \end{bmatrix} \quad \text{Eq. 17}$$

$$A_c = \begin{bmatrix} A_{c1} \\ A_{c2} \end{bmatrix} = (M_2^T M_2)^{-1} M_2^T S_{M2} \quad \text{Eq. 18}$$

The fault magnitude $I_{Fault}$ in Root-Means Squared (RMS) may be calculated using Equation 19:

$$I_{Fault} = \frac{\sqrt{A_{c1}^2 + A_{c2}^2}}{\sqrt{2}} \quad \text{Eq. 19}$$

Accordingly, a fault magnitude may be calculated for a current signal even when the CT obtaining the current signal is saturated, and does not deliver a secondary signal representative of the entire waveform of the primary current signal. Furthermore, a fault magnitude may be calculated for a current signal even when samples for pre-fault current are not available. In either case, the embodiments herein improve the operation of a line-mounted sensor by calculating a fault current magnitude even when the CT is saturated, and even when pre-fault samples are not available.

As has been suggested above, the line-mounted sensor may have a limited power supply, especially during a fault condition. For example, the line-mounted device may be powered by harvesting electric power from the electric power delivery system. The line-mounted sensor may store the electric power in temporary storage such as, for example, a supercapacitor, rechargeable battery, or the like. Furthermore, the line-mounted sensor may include a processor or memory of limited capacity. In either case, the line-mounted sensor may benefit from reducing computation complexity.

As the fault current magnitude matrix $M_2$ depends on system frequency f, and a fixed sampling rate N, (Equations 5, 11, 14), the line-mounted sensor may be configured with pre-populated or fixed fault current magnitude matrices $M_2$ at different frequencies that are expected. The pre-populated matrices may be predetermined for a particular nominal frequency (e.g. 60 Hz or 50 Hz), and frequencies in the range of the particular nominal frequency. For example, a line-mounted device configured to monitor an electric power delivery system with a nominal frequency of 60 Hz may be configured with pre-populated matrices of: 1) 60 Hz for measured frequencies from 59.75 Hz-60.25 Hz; 2) 60.5 Hz for measured frequencies from 60.25 Hz-60.75 Hz; 3) 59.50 Hz for measured frequencies from 59.25 Hz-59.75 Hz; and so forth. Accordingly, if the measured frequency at the time of the fault is 60.3 Hz, and four valid pairs are found, the line-mounted device would use the pre-populated matrix for 60.5 Hz with four pairs (Equation 14).

It should be noted that the ranges and numbers of pre-populated matrices may be different than described in the above embodiment. Furthermore, if the measured frequency falls outside of the ranges of the pre-populated matrices, the line-mounted device may use the Equations as described herein to calculate the matrices instead of using the pre-populated matrices.

Because the use of pre-populated matrices will result in some loss of accuracy of the fault magnitude, the line-mounted device may include correction factors for the difference between the measured frequency and the frequency of the selected pre-populated matrix. The correction factor may be applied to either the pre-populated matrix or the calculations resulting therefrom such as, for example, the fault magnitude.

As has been described above, the number of valid pairs needed to calculate the fault magnitude as at least two. To increase accuracy of the calculated fault magnitude, the line-mounted device may be configured to calculate the fault magnitude using valid pairs from different consecutive peaks according to the embodiments described herein, and then calculating an estimated fault magnitude using the calculated fault magnitudes. For example, the estimated fault magnitude may be an average of the calculated fault magnitudes. In another example, the estimated fault magnitude may be a weighted average of the calculated fault magnitudes. In one particular example, more weight may be given to fault magnitudes calculated from valid pairs from earlier peak pairs than the weights given to fault magnitudes calculated from valid pairs from later peak pairs. Alternatively, in certain embodiments, more weight may be given to fault magnitudes calculated from valid pairs from later peak pairs than weights given to fault magnitudes calculated from valid pairs from earlier peak pairs. In another particular example, more weight may be given to fault magnitudes calculated using more valid pairs than to fault magnitudes calculated from fewer valid pairs.

As generally described above, a fault current magnitude is determined during CT saturation by: sampling the current waveform once an overcurrent threshold is crossed; determining an unsaturated region; determining a DC component; removing the DC component; and, calculating a fault current magnitude with the DC component removed. The DC component is calculated and removed according to several embodiments as described above using Equations 4-16 above. It should be noted that the above embodiments do not disclose the exclusive methods of calculating and removing a DC component from a signal from a saturated CT. In various embodiments, the DC component may be a constant rather than a decaying signal, and its absolute magnitude may be greater than zero. In such an instance, the DC component may be calculated and then be removed using Equation 16. In such an embodiment, the method may first determine whether the DC component is a constant with an absolute magnitude greater than zero. If both conditions are met, then the embodiment may proceed with using the DC component instead of using Equations 4-15. Otherwise, the embodiment may continue as described above to calculate the DC component described in Equations 4-15.

Figure 7:
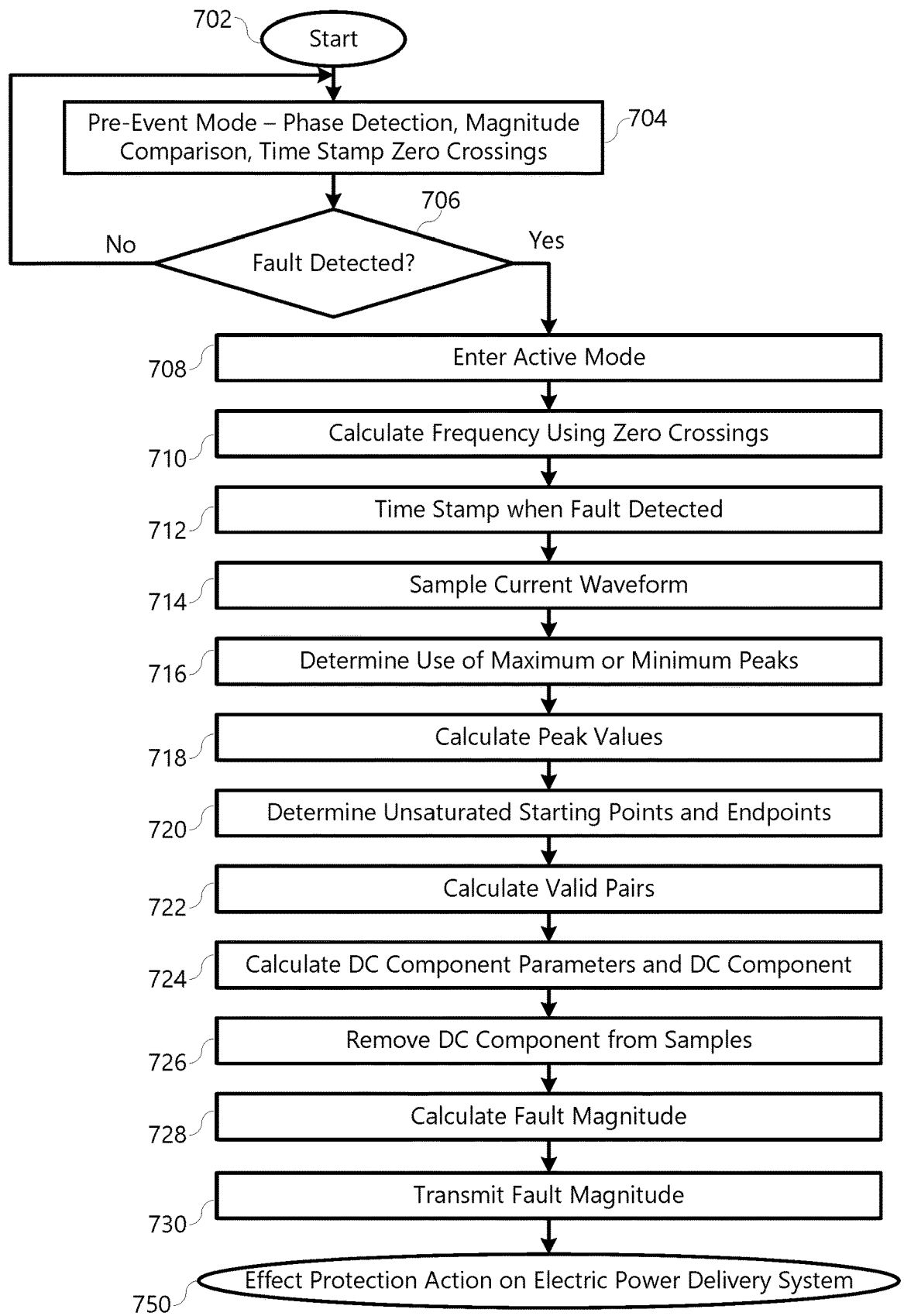
FIG. 7 illustrates a flow chart representing a method of protecting an electric power delivery system using fault magnitude values calculated by a line-mounted device under CT saturation.

FIG. 7 illustrates a flow chart of a method for improving the functioning of a line-mounted device by calculating fault magnitude even when the CT is saturated. The method starts 702 in pre-event or low-power mode, during which the line-mounted device performs phase detection, compares a magnitude against a threshold, and time-stamps zero crossings 704. The comparison of the current magnitude against the threshold may be used to determine if a fault has occurred and resulted in an overcurrent condition on the electric power delivery system. If a fault is not detected 706 (the current magnitude does not exceed the predetermined threshold), then the method continues in pre-event mode 704.

If, however, a fault is detected (the current magnitude does exceed the predetermined threshold) 706, then the method continues to cause the line-mounted device to enter active mode 708. In active mode, the line-mounted device calculates frequency using zero crossings obtained during the pre-event mode 710. The line-mounted device also applies a time stamp to the current magnitude when the fault is detected 712. The line-mounted device also samples the current waveform 714 provided by the CT. It should be noted that steps 708, 710, 712, and 714 may all be initiated upon detection of the fault 706 (upon the current magnitude exceeding the predetermined threshold). Although not separately illustrated, in various embodiments, power system frequency may be calculated during pre-event mode.

With the calculated frequency and the sampled current waveform, the line-mounted device may determine use of maximum or minimum peaks 716. This determination may be made by calculating the values of the first maximum and first minimum peak. If the first maximum peak has a larger magnitude than the first minimum peak, then the maximum peaks are used; whereas if the first minimum peak has a larger magnitude than the first maximum peak, then the minimum peaks are used.

The peak values of the maximum or minimum peaks (depending on step 716) are then calculated 718. Starting points and endpoints for unsaturated regions are determined 720. In some embodiments as described above, the samples with values closest to 90% of the peak value and 50% of the peak value may be used as starting points and endpoints of unsaturated regions for each peak. As described above, the starting points and endpoints may be different than the 90% and 50% of the above embodiments.

With the unsaturated regions determined, the line-mounted device may calculate valid pairs 722 as described above. The valid pairs may be used to calculate DC component parameters and DC components 724. With the DC component parameters and DC components, the line-mounted device may remove DC components from the samples 726. With the DC component removed, the line-mounted device may calculate the fault magnitude 728 as described herein, and transmit the fault magnitude 730 to an IED or supervisory system. The IED or supervisory system may then effect a control or monitoring operation on the electric power delivery system using the calculated and received fault magnitude from the line-powered device 750.

Accordingly, presented herein is an improvement to the functioning of a line-mounted device in that the line-mounted device is capable of determining a fault magnitude even under CT saturation; and even when pre-fault samples are not available. Furthermore, presented herein is an improvement to the functioning of an electric power delivery system due to the improvement in fault magnitude calculation being used by the IED or supervisory system from the line-mounted device for protection and monitoring functions.

It should be noted that although the line-mounted devices described herein may be illustrated as applied to a distribution portion of an electric power delivery system, the line-mounted devices may be applied to any portion of an electric power delivery system including transmission, distribution, generation, and consumption; as well as at different voltage and current levels. Furthermore, the line-mounted devices herein may be applied to overhead portions of a power system, underground portions of a power system, or enclosed portions of a power system.

Furthermore, it should be noted that the improvements herein are applicable to any system configured to determine a fault current magnitude under saturated CT conditions. Accordingly, any device, such as an IED, that obtains secondary current signals from a saturated CT may use the improvements herein to determine a fault current magnitude.

The improvements herein may be used to recreate an alternating current (AC) signal from a secondary current signal of a saturated CT. Any device that receives secondary current signals from a saturated CT may use the improvements herein to remove DC components from the sampled current signal and produce samples representative of a secondary current signal without distortions introduced by CT saturation.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A line-mounted device for an electric power delivery system, configured to determine a fault magnitude under conditions of a saturated current transformer (CT), comprising:

a current transformer in electrical communication with a conductor of the electric power delivery system, comprising a core and a winding including secondary leads;
sensor circuitry in electrical communication with the secondary leads, configured to:
calculate a frequency of a current signal on the electric power delivery system using a secondary signal from the secondary leads;
compare a current magnitude of the secondary signal against a predetermined fault current threshold;
when the current magnitude exceeds the predetermined fault current threshold, signal a controller of a fault condition;
the controller in communication with the sensor circuitry, comprising:
a processor;
a non-transitory computer-readable storage in communication with the processor, comprising instructions that when operated cause the processor to:
record samples of the secondary signal from the sensor circuitry to form a sampled secondary signal;
determine first and second peaks of the secondary signal;
calculate a first unsaturated region of the first peak of the secondary signal and a second unsaturated region of the second peak of the secondary signal;
determine valid pairs of samples from the sampled secondary signal within the first and second unsaturated regions;
calculate a DC component of the sampled secondary signal from the valid pairs of samples;
remove the DC component from the sampled secondary signal;
calculate a fault magnitude from the sampled secondary signal with the DC component removed; and
transmit the calculated fault magnitude to a consuming device for effecting a protective action on the electric power delivery system.

2. The line-mounted device of claim 1, further comprising communication circuitry in communication with the processor for transmitting the calculated fault magnitude to the consuming device.

3. The line-mounted device of claim 1, wherein each of the valid pairs includes a first sample in the first unsaturated region and a second sample in the second unsaturated region.

4. The line-mounted device of claim 3, wherein the first sample and the second sample are separated by one power system cycle.

5. The line-mounted device of claim 1, wherein the secondary signal is distorted due to saturation of the CT.

6. The line-mounted device of claim 1, wherein the calculation of the fault magnitude comprises calculation of a fault current magnitude matrix as a function of the calculated frequency of the current signal.

7. The line-mounted device of claim 1, wherein the calculation of the fault magnitude comprises use of a pre-populated fault current magnitude matrix associated with the calculated frequency of the current signal.

8. The line-mounted device of claim 1, wherein the instructions further cause the processor to:
determine a third peak of the secondary signal;
calculate a third unsaturated region of the third peak of the secondary signal;
determine valid pairs of samples from the sampled secondary signal within the second and third unsaturated regions; and
wherein the fault magnitude is calculated as an average of a first fault magnitude calculated using valid pairs from the first and second unsaturated regions and a second fault magnitude calculated using valid pairs from the second and third unsaturated regions.

9. A system for protecting an electric power delivery system, comprising:
a line-mounted device comprising a current transformer (CT) in electrical communication with a conductor of the electric power delivery system, and comprising a controller configured to:
during a pre-event mode, record times of zero crossings of a secondary current signal from the CT;
upon detection of a fault condition:
record a time of the detection of the fault condition;
calculate a frequency of a current on the electric power delivery system using the times of zero crossings of the current signal;
record samples of the secondary current signal from the CT to form a sampled secondary signal;
determine first and second peaks of the secondary signal;
calculate a first unsaturated region of the first peak of the secondary signal and a second unsaturated region of the second peak of the secondary signal;
determine valid pairs of samples from the sampled secondary signal within the first and second unsaturated regions;
calculate a DC component of the sampled secondary signal from the valid pairs of samples;
remove the DC component of the sampled secondary signal using the calculated DC component;
calculate a fault magnitude from the sampled secondary signal with the DC component removed; and
transmit the calculated fault magnitude to a consuming intelligent electronic device (IED) for effecting a protective action on the electric power delivery system; and,
the IED in communication with a portion of the electric power delivery system configured to receive the calculated fault magnitude; determine the protective action based on information from the electric power delivery system; and, effect the protective action on the electric power delivery system by signaling a circuit breaker to open in response to the determined protective action.

10. The system of claim 9, wherein each of the valid pairs includes a first sample in the first unsaturated region and a second sample in the second unsaturated region.

11. The system of claim 10, wherein the first sample and the second sample are separated by one power system cycle.

12. The system of claim 9, wherein the secondary current signal is distorted due to saturation of the CT.

13. The system of claim 9, wherein the calculation of the fault magnitude comprises calculation of a fault current magnitude matrix as a function of the calculated frequency of the current signal.

14. The system of claim 9, wherein the calculation of the fault magnitude comprises use of a pre-populated fault current magnitude matrix associated with the calculated frequency of the current signal.

15. The system of claim 9, wherein upon detection of the fault condition, the controller is configured to:

determine a third peak of the secondary signal;
calculate a third unsaturated region of the third peak of the secondary signal;
determine valid pairs of samples from the sampled secondary signal within the second and third unsaturated regions; and
wherein the fault magnitude is calculated as an average of a first fault magnitude calculated using valid pairs from the first and second unsaturated regions and a second fault magnitude calculated using valid pairs from the second and third unsaturated regions.

16. A method of improving functioning of a line-mounted device in determining fault magnitude in presence of current transformer (CT) saturation, comprising the steps of:
before detection of a fault, the line-mounted device receiving a secondary current signal using the CT in electrical communication with an electric power delivery system, determining zero crossings of the secondary current signal, time stamping and recording the zero crossings, and comparing a magnitude of the secondary current signal with a predetermined fault current threshold;
calculate a power system frequency using the zero crossings;
upon the magnitude of the secondary current signal exceeding the predetermined fault current threshold, the line-mounted device:
sampling the secondary current signal to form a sampled secondary current signal;
determining first and second peaks of the secondary current signal using the sampled secondary current signal;
calculating a first unsaturated region of the first peak of the secondary signal and a second unsaturated region of the second peak of the secondary signal;
determining valid pairs of samples from the sampled secondary signal within the first and second unsaturated regions;
calculating a DC component of the sampled secondary signal from the valid pairs of samples;
removing the DC component of the sampled secondary signal; and
calculating a fault magnitude from the sampled secondary signal with the DC component removed; and
effecting a protection action on the electric power delivery system using the calculated fault magnitude.

17. The method of claim 16, wherein each of the valid pairs includes a first sample in the first unsaturated region and a second sample in the second unsaturated region.

18. The method of claim 16, wherein the fault magnitude is calculated using a pre-populated fault current magnitude matrix associated with the calculated power system frequency.

19. The method of claim 16, further comprising the steps of:
determining a third peak of the secondary current signal;
calculating a third unsaturated region of the third peak of the secondary current signal;
determining valid pairs of samples from the sampled secondary signal within the second and third unsaturated regions; and
wherein the fault magnitude is calculated as an average of a first fault magnitude calculated using valid pairs from the first and second unsaturated regions and a second fault magnitude calculated using valid pairs from the second and third unsaturated regions.

20. A system for protecting an electric power delivery system, comprising:
a line-mounted device comprising a current transformer (CT) in electrical communication with a conductor of the electric power delivery system, and comprising a controller configured to:
during a pre-event mode, record times of zero crossings of a secondary current signal from the CT;
upon detection of an overcurrent condition using the secondary current:
record a time of the overcurrent condition;
calculate a frequency of a current on the electric power delivery system using the times of zero crossings of the current signal;
record samples of the secondary current signal from the CT to form a sampled secondary signal;
determine a first peak and a second peak of the secondary signal;
calculate a first unsaturated region of the first peak and a second unsaturated region of the second peak;
calculate a DC component of the sampled secondary signal;
remove the DC component from the sampled secondary signal;
calculate a fault magnitude from the sampled secondary signal with the DC component removed; and
transmit the calculated fault magnitude to a consuming intelligent electronic device (IED) for effecting a protective action on the electric power delivery system.

* * * * *